United States Patent
Kato et al.

(10) Patent No.: US 10,232,335 B2
(45) Date of Patent: Mar. 19, 2019

(54) METHOD FOR PRODUCING β-EUCRYPTITE FINE PARTICLES

(71) Applicant: NISSAN CHEMICAL INDUSTRIES, LTD., Tokyo (JP)

(72) Inventors: Hirokazu Kato, Funabashi (JP); Tadayuki Isaji, Funabashi (JP); Yoshiyuki Kashima, Sodegaura (JP); Jun-ichi Nakajima, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 5 days.

(21) Appl. No.: 15/543,455

(22) PCT Filed: Dec. 16, 2015

(86) PCT No.: PCT/JP2015/085295
§ 371 (c)(1),
(2) Date: Jul. 13, 2017

(87) PCT Pub. No.: WO2016/117248
PCT Pub. Date: Jul. 28, 2016

(65) Prior Publication Data
US 2018/0001292 A1     Jan. 4, 2018

(30) Foreign Application Priority Data

Jan. 22, 2015 (JP) ................ 2015-010654

(51) Int. Cl.
| | |
|---|---|
| *B01J 19/00* | (2006.01) |
| *C01B 33/26* | (2006.01) |
| *C04B 35/00* | (2006.01) |
| *C04B 35/19* | (2006.01) |
| *H05K 1/03* | (2006.01) |
| *H05K 3/46* | (2006.01) |

(52) U.S. Cl.
CPC .......... *B01J 19/0013* (2013.01); *C01B 33/26* (2013.01); *C04B 35/00* (2013.01); *C04B 35/19* (2013.01); *H05K 1/03* (2013.01); *H05K 3/46* (2013.01)

(58) Field of Classification Search
CPC ........................ C01B 33/26; B01J 19/0013
See application file for complete search history.

(56) References Cited

U.S. PATENT DOCUMENTS 4,751,203 A * 6/1988 Toussaint ............... C03C 1/006
501/33

FOREIGN PATENT DOCUMENTS

| JP | 2008-255004 A | 10/2008 |
| JP | 2014-123703 A | 7/2014 |
| JP | 2014-131042 A | 7/2014 |

OTHER PUBLICATIONS

Mar. 15, 2016 Search Report issued in International Patent Application No. PCT/JP2015/085295.
Ghosh, N. N. et al., "Synthesis of eucryptite and eucryptite-zirconia composite powders using aqueous sol-gel technique" Materials Science and Engineering, 1997, vol. B49, No. 1, pp. 79-83.
Ghosh, N. N. et al., "Sol-gel synthesis of multicomponent ceramic powders with metal formate precursors", British Ceramic Transactions, 1998, vol. 97, No. 4, pp. 180-184.

* cited by examiner

*Primary Examiner* — Stuart L Hendrickson
(74) *Attorney, Agent, or Firm* — Oliff PLC

(57) ABSTRACT

The β-eucryptite fine particle production method of the invention includes spraying, into an atmosphere at 50° C. to a temperature lower than 300° C., a solution containing a water-soluble lithium salt, a water-soluble aluminum salt, and colloidal silica, in such amounts that the mole proportions among lithium atoms, aluminum atoms, and silicon atoms (Li:Al:Si) are adjusted to 1:1:1, to thereby dry the solution, and, subsequently, firing the dried product in air at 600 to 1,300° C.

10 Claims, No Drawings

METHOD FOR PRODUCING β-EUCRYPTITE FINE PARTICLES

TECHNICAL FIELD

The present invention relates to a method for producing finely divided particles of β-eucryptite (hereinafter may be referred to as β-eucryptite fine particles).

BACKGROUND ART

In a trend for downsizing electronic devices, there is increasing demand for printed circuit boards, serving as main elements of the devices. Currently, such printed circuit boards have high element integration density and a number of layers. Thus, when there is a large difference in coefficient of thermal expansion (CTE) between the semiconductor-sealing material and the substrate board, the circuit on the board may be broken. In order to solve this problem, the CTE of the semiconductor-sealing material is reduced through a technique in which amorphous silica—an inorganic substance having small CTE—is added as a filler to a heat-resistant resin (e.g., an epoxy resin). However, amorphous silica has a positive CTE, although its value is small. Thus, even when amorphous silica is added to an epoxy resin or the like, the CTE of a sealing material made of the thus-prepared resin material cannot be sufficiently reduced.

Meanwhile, β-eucryptite (β-LiAlSiO$_4$) is a metal oxide having a negative CTE. However, when β-eucryptite is used as a filler for reducing the CTE of a semiconductor-sealing material, the particle size of β-eucryptite must be reduced to a maximum extent for enhancing the filling density in a resin material.

Patent Document 1 discloses an eucryptite-based filler for use in an insulating composite material. In Patent Document 1, eucryptite is synthesized from LiO$_2$, SiO$_2$, and Al$_2$O$_3$ as starting materials, and a thermal treatment at 1,000 to 1,400° C. is preferably performed for synthesizing single-phase eucryptite.

Patent Document 2 discloses a technique including mixing aqueous solutions of lithium chloride, aluminum chloride, and sodium silicate, subsequently forming nano-scale seed particles via precipitation or deposition, removing sodium ions as an impurity through a specific method, and heating the product at 700 to 1,300° C.

PRIOR ART DOCUMENTS

Patent Documents

[Patent Document 1] Japanese Patent Application Laid-Open (kokai) No. 2008-255004
[Patent Document 2] Japanese Patent Application Laid-Open (kokai) No. 2014-131042

SUMMARY OF THE INVENTION

Problems to be Solved by the Invention

The method disclosed in Patent Document 1 employs oxides as starting materials, and a high-temperature treatment at a temperature higher than 1,000° C. is required for forming β-eucryptite. As a result, the obtained β-eucryptite has poor crushability or disintegrability, and difficulty is encountered in enhancing the filling density in an epoxy resin or the like. Thus, the β-eucryptite of Patent Document 1 cannot serve as a useful filler for reducing the CTE of a composite material.

The production method disclosed in Patent Document 2 is not preferred. Specifically, a precipitate or deposit is formed via neutralization reaction involving lithium chloride, aluminum chloride, and sodium silicate, whereby uniformity in the element balance fails to be attained. As a result, the temperature of the thermal process for yielding β-eucryptite is disadvantageously elevated. Also, the washing step makes the production method cumbersome. Furthermore, sodium ions remain, and a part of lithium ions must be removed. The thus-obtained eucryptite assumes a mixed phase with another crystal phase (α phase) having a positive CTE. Thus, the effect of reducing CTE is minimized.

The present invention has been conceived under such circumstances, and an object of the invention is to provide a method for producing β-eucryptite fine particles, which method does not require removal of sodium ions and can produce β-eucryptite fine particles through a thermal process at a temperature lower than that employed in a conventional technique.

Means for Solving the Problems

The present inventors have conducted extensive studies in order to solve the aforementioned problems, and have found that β-eucryptite fine particles can be produced by subjecting a solution containing a water-soluble lithium salt, a water-soluble aluminum salt, and colloidal silica to spray drying and, subsequently, firing the dried product in air at 600 to 1,300° C.

Accordingly, the present invention is directed to the β-eucryptite fine particle production method of any one of the following first to fifth aspects.

A first aspect provides a method for producing β-eucryptite fine particles, characterized in that the method comprises:

spraying, into an atmosphere at 50° C. to a temperature lower than 300° C., a solution containing a water-soluble lithium salt, a water-soluble aluminum salt, and colloidal silica having a primary particle size, as determined through observation under a transmission electron microscope, of 2 to 50 nm, in such amounts that the mole proportions among lithium atoms, aluminum atoms, and silicon atoms (Li:Al:Si) are adjusted to 1:1:1, to thereby dry the solution, and, subsequently, firing the dried product in air or an oxidizing atmosphere at 600 to 1,300° C.

A second aspect is a specific embodiment of the β-eucryptite fine particle production method as described in the first aspect, wherein the β-eucryptite fine particles have a crystallite size less than 80 nm and a ratio $I_\alpha/I_\beta$ less than 0.05, wherein $I_\alpha$ represents an X-ray diffraction peak intensity attributed to a (121) plane of the α phase, and $I_\beta$ represents an X-ray diffraction peak intensity attributed to a (102) plane of the β phase.

A third aspect is a specific embodiment of the β-eucryptite fine particle production method as described in the first or second aspect, wherein the water-soluble lithium salt is a lithium organic acid salt.

A fourth aspect is a specific embodiment of the β-eucryptite fine particle production method as described in the first or second aspect, wherein the water-soluble aluminum salt is an aluminum organic acid salt.

A fifth aspect is a specific embodiment of the β-eucryptite fine particle production method as described in the third or fourth aspect, wherein the organic acid forming the lithium organic acid salt and/or the aluminum organic acid salt is at least one species selected from the group consisting of citric acid, oxalic acid, glycolic acid, malic acid, tartaric acid, lactic acid, malonic acid, succinic acid, formic acid, and acetic acid.

Effects of the Invention

The production method of the present invention employing a firing temperature of 600 to 1,300° C. enables production of β-eucryptite fine particles which exhibit excellent crushability and which have a crystallite size less than 80 nm and a ratio $I_\alpha/I_\beta$ less than 0.05, wherein $I_\alpha$ represents an X-ray diffraction peak intensity attributed to a (121) plane of the α phase, and $I_\beta$ represents an X-ray diffraction peak intensity attributed to a (102) plane of the β phase.

The β-eucryptite fine particles produced through the method according to the present invention can enhance the filling density of filler particles, when the particles are employed as a filler for a semiconductor-sealing material or the like. Thus, the invention is highly effective in enhancing insulating property and reducing CTE.

MODES FOR CARRYING OUT THE INVENTION

The present invention is directed to a β-eucryptite fine particle production method. In the present invention, no particular limitation is imposed on the method of preparing the solution containing a water-soluble lithium salt, a water-soluble aluminum salt, and colloidal silica. The water-soluble lithium salt, the water-soluble aluminum salt, and colloidal silica may be mixed through any technique.

In the solution containing a water-soluble lithium salt, a water-soluble aluminum salt, and colloidal silica, the mole proportions among lithium atoms, aluminum atoms, and silicon atoms (Li:Al:Si) upon mixing thereof are set to 1:1:1. Excess amounts of Al and Si with respect to Li are not preferred, since $Al_2O_3$ and $SiO_2$ are by-produced after firing, and these by-products disadvantageously increase CTE of β-eucryptite fine particles.

In the preparation of the solution containing a water-soluble lithium salt, a water-soluble aluminum salt, and colloidal silica, the water-soluble lithium salt in the form of powder may be used. However, an aqueous solution of the salt prepared in advance is preferably used. The solid content (as reduced to $Li_2O$) of the aqueous solution may be set to any level, but is preferably 1 to 20 mass %. The solid content (as reduced to $Al_2O_3$) of the aqueous solution may be set to any level, but is preferably 1 to 20 mass %. Colloidal silica is preferably used in the form of aqueous dispersion. The solid content (as reduced to $SiO_2$) of the aqueous dispersion may be set to any level, but is preferably 1 to 40 mass %.

The water-soluble lithium salt employed in the present invention is a lithium salt which can be dissolved in water at 25° C. and a solubility of 1 mass % or higher. Examples of the lithium salt include inorganic acid salts such as lithium chloride, lithium nitrate, and lithium sulfate; and organic acid salts such as lithium citrate, lithium oxalate, lithium glycolate, lithium malate, lithium tartrate, lithium lactate, lithium malonate, lithium succinate, lithium formate, and lithium acetate.

As the water-soluble lithium salt, there may be used a product of lithium hydroxide or lithium carbonate dissolved in an acid such as hydrochloric acid, nitric acid, sulfuric acid, citric acid, oxalic acid, glycolic acid, malic acid, tartaric acid, lactic acid, malonic acid, succinic acid, formic acid, or acetic acid.

The aforementioned water-soluble lithium salts may be used singly or in combination of two or more species.

The water-soluble aluminum salt employed in the present invention is an aluminum salt which can be dissolved in water at 25° C. and a solubility of 1 mass % or higher. Examples of the aluminum salt include inorganic acid salts such as aluminum chloride and aluminum nitrate; and organic acid salts such as aluminum citrate, aluminum oxalate, aluminum glycolate, aluminum malate, aluminum tartrate, aluminum lactate, aluminum malonate, aluminum succinate, aluminum formate, and aluminum acetate.

As the water-soluble aluminum salt, there is preferably used a basic salt formed by deflocculating or dissolving dried aluminum hydroxide gel with or in an acid such as hydrochloric acid, nitric acid, citric acid, oxalic acid, glycolic acid, malic acid, tartaric acid, lactic acid, malonic acid, succinic acid, formic acid, or acetic acid.

No particular limitation is imposed on the ratio of dried aluminum hydroxide gel to acid in the mixture, so long as dehydrated aluminum hydroxide gen can be deflocculated or dissolved under heating. The heating temperature is preferably 80° C. or higher.

The primary particle size of the colloidal silica used in the present invention is determined through observation under a transmission electron microscope, and is 2 to 50 nm, preferably 2 to 25 nm. When the primary particle size is less than 1 nm, the mixture solution has poor stability, thereby possibly forming a gel, whereas when the colloidal silica has a primary particle size in excess of 50 nm, amorphous silica may remain, and α-eucryptite (hereinafter may be referred to as α phase), having a positive coefficient of thermal expansion, tends to be formed. Thus, both cases are not preferred.

No particular limitation is imposed on the method of producing the above colloidal silica. The colloidal silica which is used in the present invention may be produced through a technique of growing colloid particles from water glass as a raw material, a technique including hydrolyzing a silicon alkoxide with subsequent particle growth, or the like.

A commercial colloidal silica product may be used as a raw material. Generally, an aqueous dispersion of colloidal silica is commercially available as aqueous silica sol (e.g., SNOWTEX (registered trademark) OXS, SNOWTEX O, or SNOWTEX 30).

Also, an organic solvent dispersion of colloidal silica is commercially available as organosilica sol. Examples of known dispersion media of the organosilica sol include methanol, isopropanol, ethylene glycol, methyl ethyl ketone, methyl isobutyl ketone, and ethyl acetate. Among such silica sol products, an acid silica sol produced by removing sodium ions from the aqueous dispersion medium is preferably used.

In drying of a raw material solution containing a water-soluble lithium salt, a water-soluble aluminum salt, and colloidal silica at mole proportions among lithium atoms, aluminum atoms, and silicon atoms (Li:Al:Si) of 1:1:1, the solution is preferably dried under such conditions that the water-soluble lithium salt, the water-soluble aluminum salt, and colloidal silica are uniformly mixed. Thus, there is preferably employed a spray dryer which can spray-dry the solution while the uniform mixing state is maintained, or a spray drying apparatus which can realize the state. In the case where the solution placed in a container such as a flask is dried in atmospheric pressure or a reduced pressure, difficulty is encountered in maintaining the uniform mixing state during drying. In such a case, the α phase ratio of β-eucryptite formed through firing increases.

The temperature of the atmosphere where drying is performed by means of a spray dryer or a like spray-drying apparatus is 50° C. to a temperature lower than 300° C. The temperature is preferably lower than the decomposition temperatures of the water-soluble lithium salt, the water-soluble aluminum salt, and colloidal silica, which are contained in the solution. No particular limitation is imposed on the atmosphere where drying is performed, and any of air, an oxidizing atmosphere, a reducing atmosphere, and an inert atmosphere may be employed.

The thus-obtained dry powder is fired in air or an oxidizing atmosphere at 600 to 1,300° C., preferably 600 to 1,000° C. The firing time is 0.5 to 50 hours, preferably 1 to 20 hours.

When the temperature of the firing atmosphere is higher than 1,300° C., sintering of the β-eucryptite fine particles proceeds, and difficulty is encountered in crushing the fired product. Thus, difficulty is encountered in elevating the filler particle filling density when the particle product is used as a filler for a semiconductor sealing material or the like, which is not preferred.

When the temperature of the firing atmosphere is lower than 600° C., reaction involving the water-soluble lithium salt, the water-soluble aluminum salt, and colloidal silica is insufficiently attained. This case is not preferred, since carbon may remain, and formation of β-eucryptite is impeded.

Before performing the aforementioned firing at 600 to 1,300° C. the dried product is preferably calcined in air or an oxidizing atmosphere at 300° C. to a temperature lower than 600° C. Through this calcining treatment, even when the dry powder contains a residual carbon component originating from an organic acid, the carbon component can be removed before firing at 600 to 1,300° C.

The amount of α phase, having a positive coefficient of thermal expansion, is preferably small in β-eucryptite. The ratio $I_\alpha/I_\beta$, which is an index for the α phase content, is preferably less than 0.05, more preferably less than 0.01, wherein $I_\alpha$ represents an X-ray diffraction peak intensity attributed to a (121) plane of the α phase, and $I_\alpha$ represents an X-ray diffraction peak intensity attributed to a (102) plane of the β phase. The X-ray diffraction peak intensity ratio $I_\alpha/I_\beta$ is calculated from the highest diffraction peak intensity $I_\alpha$ attributed to a (121) plane of the α phase observed within a 2θ range from 22.3 to 22.5°, and the highest diffraction peak intensity $I_\beta$ attributed to a (102) plane of the β phase observed within a 2θ range from 25.2 to 25.4°, the peak being detected by means of an X-ray diffractometer (X-ray: CuKα).

The β-eucryptite fine particles preferably have a crystallite size of 1 nm or larger and less than 80 nm. When the crystallite size is 80 nm or larger, sintering of β-eucryptite fine particles proceeds, and difficulty is encountered in crushing the fired product. The α phase is known to be transformed into the β phase through firing at a temperature higher than 1,000° C. In fact, when firing is performed at high temperature, phase transformation occurs, to whereby sintering proceeds. In this case, difficulty is encountered in disintegration. Thus, formation of α phase should be suppressed by controlling production conditions.

The present invention will next be described in detail by way of Examples and Comparative Examples, which should not be construed as limiting the invention thereto.

EXAMPLES

[X-Ray Diffractometry]

X-ray diffractometry of a sample was performed by means of an X-ray diffractometer RINT Ultima+ (product of Rigaku Corporation) under the following conditions: X-ray source; Cu, voltage; 40 kV, current; 40 mA, step width; 0.04°, cumulative time; 0.5 sec/step, divergence slit 1°, longitudinal divergence limiting slit 10 mm, scattering slit 1°, and light-receiving slit 0.3 mm.

[Determination of Crystallite Size]

X-ray diffraction data of each sample was analyzed by use of analysis software JADE, and crystallite size was calculated by Scherrer's equation. The crystallite size of α phase was a size orthogonal to the (121) plane, and the crystallite size of β phase was a size orthogonal to the (102) plane.

[X-Ray Diffraction Intensity Ratio]

The X-ray diffraction peak intensity ratio $I_\alpha/I_\beta$ was calculated from the X-ray diffraction data of each sample; specifically, the highest diffraction peak intensity $I_\alpha$ attributed to a (121) plane of the α phase observed within a 2θ range from 22.3 to 22.5°, and the highest diffraction peak intensity $I_\beta$ attributed to a (102) plane of the β phase observed within a 2θ range from 25.2 to 25.4°.

Production Example 1

Production of Aqueous Aluminum Citrate Solution

Citric acid monohydrate (product of KANTO KAGAKU, special grade, 99.5 mass %) (210.1 g (1 mol)) was dissolved in pure water (750 g). While the thus-prepared aqueous citric acid was stirred, dried aluminum hydroxide gel (Kyoward 200S, product of Kyowa Chemical Industry Co., Ltd., $Al_2O_3$ 53.3 mass %) (95.6 g (0.5 mol)) was added. The mixture was heated at 85° C. for 2 hours. During heating, a part of water was evaporated. Thus, pure water (51 g) was further added thereto, to thereby adjust the weight of the mixture to 1,019.6 g. The resultant mixture was caused to pass through a glass filter (GA-100, product of ADVANTEC) and quantitative filter paper (No. 5C, product of ADVANTEC), to thereby recover clear pale yellow aqueous solution of aluminum citrate. The thus-obtained aqueous aluminum citrate solution was found to have a solid content (as $Al_2O_3$) of 5.00 mass %.

Production Example 2

Production of Aqueous Lithium Citrate Solution

Lithium hydroxide monohydrate (product of KANTO, special grade, 98.0 mass %) (37.76 g (0.9 mol)) was dissolved in pure water (734.6 g), and then citric acid monohydrate (product of KANTO KAGAKU, special grade, 99.5 mass %) (63.0 g (0.3 mol)) was added to the solution. The mixture was stirred at room temperature for 10 minutes, to thereby form aqueous lithium citrate solution. The thus-obtained aqueous lithium citrate solution was found to have a solid content (as $Li_2O$) of 1.60 mass %.

Production Example 3

Production of Aqueous Aluminum Oxalate Solution

Oxalic acid dihydrate (product of KANTO KAGAKU, special grade, 99.5 mass %) (378.8 g (3 mol)) was dissolved in pure water (1469.6 g). While the thus-prepared aqueous oxalic acid was stirred, dried aluminum hydroxide gel (Kyoward 200S, product of Kyowa Chemical Industry Co., Ltd., $Al_2O_3$ 53.3 mass %) (191.3 g (1 mol)) was added. The mixture was heated at 85° C. for 2 hours. During heating, a part of water was evaporated. Thus, pure water (45 g) was further added thereto, to thereby adjust the weight of the mixture to 2,039.2 g. The resultant mixture was caused to pass through a glass filter (GA-100, product of ADVANTEC) and quantitative filter paper (No. 5C, product of ADVANTEC), to thereby recover clear pale yellow aqueous solution of aluminum oxalate. The thus-obtained aqueous aluminum oxalate solution was found to have a solid content (as $Al_2O_3$) of 5.00 mass %.

Production Example 4

Production of Aqueous Lithium Oxalate Solution

Lithium hydroxide monohydrate (product of KANTO, special grade, 98.0 mass %) (42.0 g (1 mol)) was dissolved in pure water (819.1 g), and then oxalic acid dihydrate (product of KANTO KAGAKU, special grade, 99.5 mass %) (63.0 g (0.5 mol)) was added to the solution. The mixture was stirred at room temperature for 10 minutes, to thereby form aqueous lithium oxalate solution. The thus-obtained aqueous lithium oxalate solution was found to have a solid content (as $Li_2O$) of 1.62 mass %.

Production Example 5

Production of Aqueous Aluminum Malonate Solution

Malonic acid (product of KANTO KAGAKU, special grade, 99.5 mass %) (156.1 g (1.5 mol)) was dissolved in pure water (767.7 g). While the thus-prepared aqueous malonic acid was stirred, dried aluminum hydroxide gel (Kyoward 200S, product of Kyowa Chemical Industry Co., Ltd., $Al_2O_3$ 53.3 mass %) (95.6 g (0.5 mol)) was added. The mixture was heated at 85° C. for 2 hours. During heating, a part of water was evaporated. Thus, bur e water (45 g) was further added thereto, to thereby adjust the weight of the mixture to 1,019.6 g. The resultant mixture was caused to pass through a glass filter (GA-100, product of ADVANTEC) and quantitative filter paper (No. 5C, product of ADVANTEC), to thereby recover clear pale yellow aqueous solution of aluminum malonate. The thus-obtained aqueous aluminum malonate solution was found to have a solid content (as $Al_2O_3$) of 5.00 mass %.

Production Example 6

Production of Aqueous Lithium Malonate Solution

Lithium hydroxide monohydrate (product of KANTO, special grade, 98.0 mass %) (42.0 g (1 mol)) was dissolved in pure water (370.4 g), and then malonic acid (product of KANTO KAGAKU, special grade, 99.5 mass %) (52.0 g (0.5 mol)) was added to the solution. The mixture was stirred at room temperature for 10 minutes, to thereby form aqueous lithium malonate solution. The thus-obtained aqueous lithium malonate solution was found to have a solid content (as $Li_2O$) of 3.22 mass %.

Example 1

The aqueous aluminum citrate solution produced in Production Example 1 (917.6 g ($Al_2O_3$ 0.45 mol)) and the aqueous lithium citrate solution produced in Production Example 2 (835.4 g) were added to colloidal silica (SNOWTEX (registered trademark) OXS, product of Nissan Chemical Industries, Ltd., silica content: 10.5 mass %, and primary particle size (determined through observation under a transmission electron microscope): 5 nm) (515.0 g ($SiO_2$ 0.9 mol)). The resultant mixture was stirred at room temperature for 10 minutes. The thus-obtained liquid mixture was found to have a specific weight of 1.075, a pH of 2.8, and an electric conductivity of 15.0 mS/cm. The liquid mixture was dried by means of a spray dryer (Purvis Mini Spray GB210-A, product of Yamato Scientific Co., Ltd.) under the following conditions: inlet temperature; 185° C., atomizing air pressure; 1.4 kgf/cm$^2$, aspirator flow; 0.50 m$^3$/minute, and liquid mixture feeding rate; 4 g/minute. The outlet temperature was 80±3° C. The thus-obtained dry powder (3.0 g) was placed in an alumina crucible and fired in air at 800° C. for 1 hour by means of an electric furnace, to thereby yield a white powder with a pale gray tone (0.7 g). The powder was identified by X-ray diffraction. As a result, the formed phase was found to be substantially a single phase composed of β-eucryptite, and the X-ray diffraction peak intensity ratio $I_\alpha/I_\beta$ was less than 0.01. The β phase was found to have a crystallite size of 62 nm. The specific surface area, determined through the nitrogen adsorption method, was 1.6 m$^2$/g.

Example 2

The procedure of Example 1 was repeated, except that the unfired powder was calcined in air at 500° C. for 5 hours by means of an electric furnace, before firing in air at 800° C. The obtained white powder was identified by X-ray diffraction. As a result, the formed phase was substantially a single phase composed of β-eucryptite, and the X-ray diffraction peak intensity ratio $I_\alpha/I_\beta$ was less than 0.01. The β phase was found to have a crystallite size of 61 nm. The specific surface area, determined through the nitrogen adsorption method, was 1.3 m$^2$/g.

Example 3

The aqueous aluminum oxalate solution produced in Production Example 3 (1,019.6 g ($Al_2O_3$ 0.5 mol)) and the aqueous lithium oxalate solution produced in Production Example 4 (924.1 g ($Li_2O$ 0.5 mol)) were added to colloidal silica (SNOWTEX (registered trademark) OXS, product of Nissan Chemical Industries, Ltd., silica content: 10.5 mass %, and primary particle size (determined through observation under a transmission electron microscope): 5 nm) (572.2 g ($SiO_2$ 1 mol)). The resultant mixture was stirred at room temperature for 10 minutes. The thus-obtained liquid mixture was found to have a specific weight of 1.068, a pH of 2.0, and an electric conductivity of 22.3 mS/cm. The liquid mixture was dried by means of a spray dryer (Purvis Mini Spray GB210-A, product of Yamato Scientific Co., Ltd.) under the following conditions: inlet temperature; 185° C., atomizing air pressure; 1.4 kgf/cm$^2$, aspirator flow; 0.50 m$^3$/minute, and liquid mixture feeding rate; 4 g/minute. The outlet temperature was 80±3° C. The thus-obtained dry powder (3.0 g) was placed in an alumina crucible and fired in air at 800° C. for 1 hour by means of an electric furnace, to thereby yield a white powder (1.1 g). The powder was identified by X-ray diffraction. As a result, the formed phase was substantially a single phase composed of β-eucryptite, and the X-ray diffraction peak intensity ratio $I_\alpha/I_\beta$ was 0.02. The β phase was found to have a crystallite size of 46 nm. The specific surface area, determined through the nitrogen adsorption method, was 4.1 m$^2$/g.

Example 4

The procedure of Example 1 was repeated, except that the temperature in firing in air for 1 hour was changed to 900° C., after spray drying of a liquid mixture of colloidal silica, aqueous aluminum citrate, and aqueous lithium citrate, to thereby yield a white powder (0.9 g). The obtained white powder was identified by X-ray diffraction. As a result, the formed phase was substantially a single phase composed of β-eucryptite, and the X-ray diffraction peak intensity ratio $I_\alpha/I_\beta$ was less than 0.01. The β phase was found to have a crystallite size of 65 nm. The specific surface area, determined through the nitrogen adsorption method, was 1.6 m$^2$/g.

Example 5

The procedure of Example 3 was repeated, except that the firing in air was performed at 600° C. for 20 hours, after spray drying of a liquid mixture of colloidal silica, aqueous aluminum oxalate, and aqueous lithium oxalate, to thereby yield a white powder (1.1 g). The obtained white powder was identified by X-ray diffraction. As a result, the formed phase was substantially a single phase composed of β-eucryptite, and the X-ray diffraction peak intensity ratio $I_\alpha/I_\beta$ was 0.03. The β phase was found to have a crystallite size of 44 nm. The specific surface area, determined through the nitrogen adsorption method, was 7.3 m$^2$/g.

Example 6

The procedure of Example 1 was repeated, except that colloidal silica (SNOWTEX (registered trademark) OL, product of Nissan Chemical industries, Ltd., silica content: 40.5 mass %, and primary particle size (determined through observation under a transmission electron microscope): 42 nm) was used instead of colloidal silica (SNOWTEX (registered trademark) OXS, product of Nissan Chemical Industries, Ltd., silica content: 10.5 mass %, and primary particle size (determined through observation under a transmission electron microscope): 5 nm). The thus-obtained pale gray-tone, white powder was identified by X-ray diffraction. As a result, the formed phase was substantially a single phase composed of β-eucryptite, and the X-ray diffraction peak intensity ratio $I_\alpha/I_\beta$ was 0.03. The β phase was found to have a crystallite size of 24 nm. The specific surface area, determined through the nitrogen adsorption method, was 24.7 m$^2$/g.

Example 7

The aqueous aluminum malonate solution produced in Production Example 5 (1,019.6 g (Al$_2$O$_3$ 0.5 mol) and the aqueous lithium malonate solution produced in Production Example 6 (464.4 g (Li$_2$O 0.5 mol)) were added to colloidal silica (SNOWTEX (registered trademark) OXS, product of Nissan Chemical Industries, Ltd., silica content: 10.5 mass %, and primary particle size (determined through observation under a transmission electron microscope): 5 nm) (572.2 g (SiO$_2$ 1 mol)). The formed mixture was stirred at room temperature for 10 minutes. The resultant liquid mixture was found to have a specific weight of 1.090, a pH of 3.83, and an electric conductivity of 15.6 mS/cm. The liquid mixture was dried by means of a spray dryer (Purvis Mini Spray GE210-A, product of Yamato Scientific Co., Ltd.) under the following conditions: inlet temperature; 185° C., atomizing air pressure; 1.4 kgf/cm$^2$, aspirator flow; 0.50 m$^3$/minute, and liquid mixture feeding rate; 4 g/minute. The outlet temperature was 80±3° C. The thus-obtained dry powder (3.0 g) was placed in an alumina crucible and calcined in air at 500° C. for 5 hours by means of an electric furnace. Then, the calcined product was fired in air at 800° C. for 1 hour, to thereby yield a white powder (0.8 g). The white powder was identified by X-ray diffraction. As a result, the formed phase was substantially a single phase composed of β-eucryptite, and the X-ray diffraction peak intensity ratio $I_\alpha/I_\beta$ was 0.04. The β phase was found to have a crystallite size of 41 nm. The specific surface area, determined through the nitrogen adsorption method, was 2.7 m$^2$/g.

Comparative Example 1

The procedure of Example 1 was repeated, except that firing in air was performed by means of the electric furnace at 500° C. for 5 hours. The thus-obtained black powder was identified by X-ray diffraction. As a result, a halo pattern was observed. Thus, a β-eucryptite crystalline phase was not identified.

Comparative Example 2

The procedure of Example 1 was repeated, except that, instead of carrying out spray drying of the liquid mixture in the drying step, the liquid mixture was placed in an eggplant-shaped flask and subjected to drying under reduced pressure at 30 Torr by means of a rotary evaporator. The thus-obtained pale gray-tone, white powder was identified by X-ray diffraction. As a result, the formed phase was found to be a mixed phase composed of the α phase and the β phase, and the X-ray diffraction peak intensity ratio $I_\alpha/I_\beta$ was 0.13. The β phase was found to have a crystallite size of 34 nm. The specific surface area, determined through the nitrogen adsorption method, was 10.1 m$^2$/g.

Comparative Example 3

The procedure of Example 1 was repeated, except that colloidal silica (SNOWTEX (registered trademark) OLZ, product of Nissan Chemical Industries, Ltd silica content: 35.5 mass %, and primary particle size (determined through observation under a transmission electron microscope): 80 nm) was used instead of colloidal silica (SNOWTEX (registered trademark) OXS, product of Nissan Chemical Industries, Ltd., silica content: 10.5 mass %, and primary particle size (determined through observation under a transmission electron microscope): 5 nm). The thus-obtained pale gray-tone, white powder was identified by X-ray diffraction. As a result, the formed phase was a mixed phase composed of the α phase and the β phase, and the X-ray diffraction peak intensity ratio $I_\alpha/I_\beta$ was 0.08. Furthermore, a halo pattern attributed to an amorphous phase was observed. The β phase was found to have a crystallite size of 34 nm. The specific surface area, determined through the nitrogen adsorption method, was 10.1 m$^2$/g.

Comparative Example 4

An aqueous solution prepared by dissolving lithium hydroxide monohydrate (4.20 g) in pure water (50 g) was added to colloidal silica (SNOWTEX (registered trademark) OXS, product of Nissan Chemical Industries, Ltd., silica content: 10.5 mass %, and primary particle size (determined through observation under a transmission electron microscope): 5 nm) (57.2 g). Subsequently, dried aluminum hydroxide gel (Kyoward 200S, product of Kyowa Chemical Industry Co., Ltd., Al$_2$O$_3$ 53.3 mass %) (9.57 g) was added thereto. The mixture was stirred for 10 minutes, to thereby prepare a slurry. The slurry-form mixture was placed in an eggplant-shaped flask and subjected to drying under reduced pressure at 30 Torr by means of a rotary evaporator. The thus-obtained white powder was placed in an alumina crucible and fired in air at 800° C. for 1 hour by means of an electric furnace, to thereby yield a white powder. The powder was identified by X-ray diffraction. As a result, the formed phase was a mixed phase composed of the α phase and the β phase, and the X-ray diffraction peak intensity ratio $I_\alpha/I_\beta$ was 0.17. The β phase was found to have a crystallite size of 24 nm. The specific surface area, determined through the nitrogen adsorption method, was 24.8 $m^2/g$.

Comparative Example 5

An aqueous solution prepared by dissolving lithium hydroxide monohydrate (4.20 g) in pure water (50 g) was added to colloidal silica (SNOWTEX (registered trademark) OXS, product of Nissan Chemical Industries, Ltd., silica content: 10.5 mass %, and primary particle size (determined through observation under a transmission electron microscope): 5 nm) (57.2 g). Subsequently, dried aluminum hydroxide gel (Kyoward 200S, product of Kyowa Chemical Industry Co., Ltd., $Al_2O_3$ 53.3 mass %) (9.57 g) was added thereto. The mixture was stirred for 10 minutes, to thereby prepare a slurry. The slurry-form mixture was tried to be dried by means of a spray dryer (Purvis Mini Spray GE210-A, product of Yamato Scientific Co., Ltd.) under the following conditions: inlet temperature; 185° C., atomizing air pressure; 1.4 $kgf/cm^2$, aspirator flow; 0.50 $m^3$/minute, and liquid mixture feeding rate; 4 g/minute. However, a nozzle of the dryer was immediately plugged, and spraying was incomplete.

INDUSTRIAL APPLICABILITY

According to the production method of the present invention, β-eucryptite fine particles can be produced at a firing temperature lower than that employed in a conventional technique. The thus-obtained powder has excellent crushability or disintegrability and serves as a useful filler which can enhance the insulation property of a resin for use in a printed wiring board and a semiconductor sealing material and which can reduce CTE.

The invention claimed is:

1. A method for producing β-eucryptite fine particles, the method comprising:
   spraying, into an atmosphere at 50° C. to a temperature lower than 300° C., a solution containing a water-soluble lithium salt, a water-soluble aluminum salt, and colloidal silica having a primary particle size, as determined through observation under a transmission electron microscope, of 2 to 50 nm, in such amounts that the mole proportions among lithium atoms, aluminum atoms, and silicon atoms (Li:Al:Si) are adjusted to 1:1:1, to thereby dry the solution, and,
   subsequently, firing the dried product in air or an oxidizing atmosphere at 600 to 1,300° C.

2. The method according to claim 1, wherein the water-soluble aluminum salt is an aluminum organic acid salt.

3. The method according to claim 2, wherein the organic acid forming the lithium organic acid salt and/or the aluminum organic acid salt is at least one species selected from the group consisting of citric acid, oxalic acid, glycolic acid, malic acid, tartaric acid, lactic acid, malonic acid, succinic acid, formic acid, and acetic acid.

4. The method according to claim 1, wherein the water-soluble lithium salt is a lithium organic acid salt.

5. The method according to claim 4, wherein the organic acid forming the lithium organic acid salt and/or the aluminum organic acid salt is at least one species selected from the group consisting of citric acid, oxalic acid, glycolic acid, malic acid, tartaric acid, lactic acid, malonic acid, succinic acid, formic acid, and acetic acid.

6. The method according to claim 1, wherein the β-eucryptite fine particles have a crystallite size less than 80 nm and a ratio $I_\alpha/I_\beta$ less than 0.05, wherein $I_\alpha$ represents an X-ray diffraction peak intensity attributed to a (121) plane of the α phase, and $I_\beta$ represents an X-ray diffraction peak intensity attributed to a (102) plane of the β phase.

7. The method according to claim 6, wherein the water-soluble aluminum salt is an aluminum organic acid salt.

8. The method according to claim 7, wherein the organic acid forming the lithium organic acid salt and/or the aluminum organic acid salt is at least one species selected from the group consisting of citric acid, oxalic acid, glycolic acid, malic acid, tartaric acid, lactic acid, malonic acid, succinic acid, formic acid, and acetic acid.

9. The method according to claim 6, wherein the water-soluble lithium salt is a lithium organic acid salt.

10. The method according to claim 9, wherein the organic acid forming the lithium organic acid salt and/or the aluminum organic acid salt is at least one species selected from the group consisting of citric acid, oxalic acid, glycolic acid, malic acid, tartaric acid, lactic acid, malonic acid, succinic acid, formic acid, and acetic acid.

* * * * *

UNITED STATES PATENT AND TRADEMARK OFFICE
CERTIFICATE OF CORRECTION

PATENT NO. : 10,232,335 B2
APPLICATION NO. : 15/543455
DATED : March 19, 2019
INVENTOR(S) : Hirokazu Kato et al.

It is certified that error appears in the above-identified patent and that said Letters Patent is hereby corrected as shown below:

On the Title Page

ITEM (56), under "Other Publications", please add two non-Patent literature references:

--November 9, 2018 Office Action in Taiwanese Patent Application No. 10721051910, including English Abstract of the page of "Search Results for No. 104143191 application" in Office Action.--

--Li YAN, "Research on preparation and properties of ?-Eucrytite Superfine Powder", Changchun University of Science and Technology, Doctoral thesis, March 1, 2011, p. 1-49.--

Signed and Sealed this
Twenty-ninth Day of October, 2019

Andrei Iancu
*Director of the United States Patent and Trademark Office*